United States Patent [19]

Martin et al.

[11] Patent Number: 4,595,604
[45] Date of Patent: Jun. 17, 1986

[54] CONDUCTIVE COMPOSITIONS THAT ARE DIRECTLY SOLDERABLE AND FLEXIBLE AND THAT CAN BE BONDED DIRECTLY TO SUBSTRATES

[75] Inventors: Frank W. Martin, Baldwin Place; Samson Shahbazi, Yonkers, both of N.Y.

[73] Assignee: Rohm and Haas Company, Philadelphia, Pa.

[21] Appl. No.: 631,973

[22] Filed: Jul. 18, 1984

[51] Int. Cl.$^4$ ............................ B05D 5/12; H01B 1/02
[52] U.S. Cl. ...................................... 427/96; 427/282; 427/393.5; 427/393.6; 252/514; 524/440; 428/901
[58] Field of Search ................. 252/514; 524/439, 440; 523/457, 459; 427/282, 96, 393.5, 396.3; 428/901

[56] References Cited

U.S. PATENT DOCUMENTS

| | | | |
|---|---|---|---|
| 3,412,043 | 11/1968 | Gilliland | 252/514 |
| 4,371,459 | 2/1983 | Nazarenko | 252/514 |
| 4,410,457 | 10/1983 | Fujimura et al. | 252/514 |

*Primary Examiner*—Josephine L. Barr
*Attorney, Agent, or Firm*—Carl W. Battle; Michael B. Fein; W. E. R. Scott

[57] ABSTRACT

This invention provides conductive compositions that are solderable and flexible and that can be bonded directly to substrates. These compositions are made up of a combination of silver exclusively in the form of flake and resin system, said resin system comprising of vinyl chloride/vinyl acetate copolymer, epoxy resin and epoxy hardner. Also provided is a method of making these compositions. Another embodiment of this invention is a method of applying conductive compositions directly to substrates by bonding the conductive compositions directly to the substrate. Once cured, the compositions demonstrate good adhesion directly to the substrate in addition to excellent conductivity, solderability and flexibility characteristics.

16 Claims, No Drawings

CONDUCTIVE COMPOSITIONS THAT ARE DIRECTLY SOLDERABLE AND FLEXIBLE AND THAT CAN BE BONDED DIRECTLY TO SUBSTRATES

BACKGROUND OF THE INVENTION

1. Field of the Invention

This invention relates to conductive compositions which are solderable and flexible, and to their method of production. More particularly, this invention relates to conductive compositions that exhibit good flexibility and solderability and that can be bonded directly to substrates.

2. Description of the Prior Art

An electrically conductive composition applied to a supporting or base structure must be sufficiently conductive to carry electric current and must be firmly adhered or bonded to the support or base. Furthermore, it is desirable that the conductive composition be directly solderable and flexible.

U.S. Pat. No. 3,030,237 discloses an improved coating material essentially comprised of organic resin carrier and a suitable metallic pigment. The invention lies in the discovery that a coating having a metallic pigment component consisting of a mixture of ball and flake particles having particular dimensions and used in certain proportions, in combination with an organic resin carrier, can exhibit good adhesion and electrical conductivity. Also disclosed is that conventional wire leads may be silver-soldered to the cured coating using entirely common silver soldering techniques.

U.S. Pat. No. 2,959,498 discloses a method of forming conductive silver circuits by first applying to a resinous dielectric surface a layer of an incompletely cured thermosetting resin, and then applying on said layer, in the outline of the desired conductive circuit, a layer of finely divided silver admixed with a thermoplastic resin containing a solvent for both of said resins, and then heating to cure both layers of applied resins. It is essential that the resinous panel first be coated with a thermosetting resin and that this resin is only partially cured before application of the conductive composition. The conductive circuit is applied over the undercoating, preferably by squeezing a silver paste in the desired electrical circuit pattern. The silver paste is composed of finely divided silver particles in a thermoplastic resin in a ratio of between 4:1 and 10:1 silver to resin. The resulting silver circuit pattern is firmly adhered to the resinous substrate and the silver lines readily accepts solder.

U.S. Pat. No. 4,371,459 discloses screen printable conductor composition that is flexible comprising (a) a conductive phase containing silver and base metal powders dispersed in a solution of (b) a multipolymer prepared by copolymerization of vinyl acetate, vinyl chloride, and an ethylenically unsaturated dicarboxylic acid and a linear aromatic polyester resin dissolved in (c) volatile nonhydrocarbon solvent. These compositions are particularly useful for application to membrane touch switches.

U.S. patent application Ser. No. 537,740 filed Sept. 30, 1983, now U.S. Pat. No. 4,564,563, discloses a solderable electrically conductive composition comprising metallic silver particles embedded in a matrix formed from acrylic, carboxylated vinyl and an epoxy. The composition is formed by dissolving acrylic powder and vinyl powder in respective solvents to form a first solution and a second solution. The solutions are then mixed with metallic silver particles and an epoxy to form an ink which is applied to a substrate to form a film thereon. The film is cured to evaporate the solvents and allow polymerization to occur thereby having a solderable electrically conductive film.

Heretofore, conductive compositions developed for use in connection with supporting or base structures or other electrical equipment have been characterized by unacceptably high electrical resistivity or unacceptably low adhesion to the supporting or base material. Furthermore, many prior art compositions suffer from the deficiency of not being directly solderable; that is, the time consuming and expensive process of electroless plating or the like must be employed in order to apply solder to the conductive composition. Yet another deficiency lies in the fact that many of the prior art conductive compositions are not flexible and can therefore not be applied to flexible substrates. Additionally, many of the prior art compositions cannot be bonded directly to the substrate on which they are applied.

While some prior art compositions do solve some of these deficiencies they are deficient in that complicated formulations employing additional compounds must be used and additional processing steps must be conducted. Furthermore, none of the prior art compositions exhibit all of the characteristics of sufficient conductivity, flexibility and solderability while at the same time being capable of direct bonding to substrates.

It has been a long sought goal to provide conductive compositions that have good conductivity, adhesion and flexibility and which are directly solderable without having to resort to the need for complicated procedures or formulations. It has also been desired to have a conductive composition that has sufficient conductivity and flexibility to make it capable of replacing mechanical end connectors on flexible polymer thick film circuits.

SUMMARY OF THE INVENTION

It is therefore an object of the invention to provide conductive compositions that adhere directly to the substrate upon which they are applied, are flexible and directly solderable.

It is another object of the invention to provide conductive compositions having good electrical characteristics.

It is another object of the invention to provide conductive compositions which are solderable without the need to use complicated procedures such as electroless plating.

It is yet another object to provide conductive compositions that have sufficient conductivity and flexibility to enable it to replace mechanical end connectors on flexible polymer thick film circuits.

Another object of the invention is to provide a method of making conductive compositions that exhibit the above mentioned characteristics.

These objects and other objects that will become apparent, are achieved by the present invention which comprises, in one aspect, a directly solderable and flexible conductive composition comprising silver exclusively in the form of flake and a resin system, said resin system comprising vinyl chloride/vinyl acetate copolymer, epoxy resin and epoxy hardner. Another aspect of the invention is a method of making a conductive composition comprising dissolving vinyl chloride/vinyl acetate copolymer in ketone solvent to form a first solution, dissolving epoxy resin and epoxy hardner in ester solvent to form a second solution and then mixing the first and second solutions with silver flake to form a mixture such that the silver flake is substantially wetted and dispersed. Yet another aspect of the invention is a method of applying a conductive composition onto a substrate comprising bonding the conductive composition directly to the substrate.

DETAILED DESCRIPTION OF THE INVENTION

The composition of the instant invention comprises silver flake and a resin system, said resin system comprising vinyl chloride/vinyl acetate copolymer, epoxy resin and epoxy hardner. In practice, the silver flake is distributed throughout the resin system.

This resin system not only holds the silver flake in suspension but also provides adhesion of the silver flake to the substrate, holds the silver flake together such that a conductive path is formed and provides flexibility. Furthermore, on curing the resin pulls away from the silver towards the substrate thus leaving a highly enriched silver layer on top.

The compositions of the instant invention are applied to substrates while in the liquid state, that is, the compositions are mixed with a solvent which acts as a vehicle. Once applied to the substrate the composition is cured and the solvent evaporates leaving a dried, cured composition that contains only traces of solvent. In the following discussion, ratios of certain elements employed will be disclosed; it is important to point out that these ratios relate to the composition in its dried and cured state, not to the composition in its liquid state during the process of manufacture, that is, when containing a solvent, unless otherwise indicated.

It is important to note that for the purpose of this invention the silver employed must be 100% silver flake. Silver in other forms such as, for example, ball or mixtures of ball and flake will not lead to the production of a composition that demonstrates all of the advantages of the compositions produced according to the instant invention. We consider a particle to be in flake form when the distance across the particle is at least five times greater than the particle is thick. Preferably, the particle should be ten times greater across than it is thick. The presence of only silver flake has a further advantage in that it (the silver flake) seems to contribute to reducing or eliminating silver migration problems seen in the prior art compositions. The average particle size of the silver flake may be from about 0.5 microns to about 50 microns, preferably in the range of about 2 microns to about 4 microns, It is understood that silver flake particles may be present having a particle size of less than 0.5 microns or more than 50 microns; as long as the average particle size of the silver flake is between 0.5 microns and 50 microns, the compositions of the invention can be prepared. If the average particle size of the silver flake is less than 0.5 microns, there will be difficulty in getting the compositions to load this quantity of silver. If the silver is too fine, the consistancy of the composition will be too clay-like. If the average particle size of the silver flake is above about 50 microns, then the composition will be very difficult to apply. For example, the composition will tend to clog up during a screening process or the like. The cured compositions of the invention contain between about 88% and 93%, by weight, silver flake.

The vinyl chloride/vinyl acetate copolymer that may be used in the compositions of the instant invention have a number average molecular weight range of between about 14,000 and 35,000. Preferably, the number average molecular weight of the copolymer is about 20,000. The higher molecular weight vinyl chloride/vinyl acetate copolymer has better durability and toughness characteristics than the lower molecular weight vinyl chloride/vinyl acetate copolymers. We have found that other types of vinyl chloride/vinyl acetate polymers do not function as the vinyl chloride/vinyl acetate copolymer does of the instant invention. E.I. DuPont de Nemours sells a carboxyl modified vinyl chloride/vinyl acetate copolymer designated V.M.C.C. This product has a weight ratio of vinyl chloride to vinyl acetate to maleic acid of 83:16:1. Compositions made with this product deteriorate as soon as solder is applied. Apparently, the presence of the dicarboxylic acid is detrimental to the end uses disclosed in this invention. A polyvinyl buterol was also tried. This is a modified polyvinyl alcohol. The composition made with this resin also disintegrated as soon as solder was applied. The compositions of the instant invention require a high performance vinyl chloride/vinyl acetate copolymer; low molecular weight vinyl chloride/vinyl acetate copolymers or modified vinyl chloride/vinyl acetate copolymers do not work. The weight ratio of vinyl chloride to vinyl acetate can be from about 80:20 to about 90:10. Preferably, the weight ratio is from about 86:16 to about 88:12. The vinyl chloride/vinyl acetate copolymer having a number average molecular weight of 35,000 had a weight ratio of vinyl chloride to vinyl acetate of about 90:10; the vinyl chloride/vinyl acetate copolymer having a number average molecular weight of 14,000 had a weight ratio of vinyl chloride to vinyl acetate of about 86:14.

Although the examples contained in this specification were all carried out by a vinyl chloride/vinyl acetate copolymer designed VYHH supplied by Union Carbide, other types of vinyl chloride/vinyl acetate copolymer may be employed as long as the copolymer conforms to the specifications hereinbefore described.

The epoxy resin employed as part of the resin system can be any type of epoxy resin that is commercially available and that conforms to the following specifications. We have used an epoxy resin sold by Ciba Geigy deisgnated Araldite 6010. This is an unmodified liquid of medium viscosity which is based on bisphenol A and epichlorohydrin. The epoxy hardner employed is supplied by Ciba Geigy and deisgnated HY 940. The purpose of the epoxy hardner is to crosslink with the epoxy resin to form a solid under curing conditions; the epoxy resin and epoxy hardner employed in the instant invention must not crosslink at room temperature. It must therefore be a one step heat curable system and be compatible with the other ingredients such as the solvent. The final stipulation is that the epoxy resin can't be a water based epoxy resin.

The weight ratio used of silver flake to resin system is important. If these elements are not used within the ranges of ratios specified, the compositions produced will not possess all of the characteristics hereinbefore described. In the broadest sense the weight ratio of silver flake to resin system should be from about 88:12 to about 95:5 and preferably from about 89:11 to about 91:9.

Within the resin system, the weight ratio of vinyl chloride/vinyl acetate copolymer to epoxy resin and hardner is from about 100:1 to about 2:1, perferably from about 2:1 to about 4:1. The weight ratio of epoxy resin to epoxy hardner is from about 30:70 to about 40:60, preferably from about 34:66 to about 38:62. Additionally, the weight ratio of vinyl chloride/vinyl acetate copolymer to epoxy resin and epoxy hardner is from about 100:1 to about 2:1.

The compositions of this invention should have silver flake present in an amount from about 88% to about 95% of the total composition, by weight, and the resin system is present in an amount of from about 7% to about 12% of the total composition, by weight. Furthermore, the vinyl chloride/vinyl acetate copolymer is present in an amount from about 4% to about 7%, by weight, of the total composition, the epoxy hardner is present in an amount of from about 0.5% to about 3%, by weight, of the total composition and the epoxy resin is present in an amount of from about 0.25% to about 2%, by weight, of the total composition.

The composition of this invention, as mentioned before, demonstrate advantages over the prior art compositions. For example, the compositions are flexible such that they can be applied to a flexible substrate such as, for example, membrane key boards. When we say that the compositions are flexible, we mean that the compositions applied to substrates can be subjected to deformative forces and will not release from the substrate or crack or break. The composition, in its deformed state, will function as well as the composition in its undeformed state. The most severe form of deformation would be to put a crease in the composition. Even under this condition the composition functions well. If the composition cracks or breaks as a result of being distorted the composition would not be considered flexible; cracks in the composition cause a severe decrease in conductivity and other electrical and mechanical properties.

Another advantage of the compositions of the instant invention is that they are directly solderable. This means that they accept solder directly without the engineer having to resort to the use of time consuming and expensive procedures such as electroless plating. The compositions can be soldered by any one of a number of methods such as, for example, dip or reflow soldering techniques, as long as the solder temperature does not exceed 205° C. Of course, the need for the use of a solder flux is not obviated by the compositions of the instant invention. Solder flux is a resin based material that aids the wetability of compositions. Solder flux is non-conductive, is widely used and is generally a liquid. The flux can be applied in a variety of ways. Pre-fluxing can be employed wherein the composition to be soldered is first dipped into liquid flux and then the solder is applied when the composition is still wet. Alternatively, the flux can be a component of a solder-alloy mixture. In this case, the vehicle is the flux and pre-fluxing is not required. Additionally, the flux may also be activated or not activate. Activated flux cleans the surface to be soldered.

The compositions of the invention can be applied to a variety of substrates whether rigid or flexible and that are made from a variety of materials. Specifically, the substrates may be ceramic or resinous in nature. An example of a typical substrate is a printed circuit board. The only limitation on the substrate is that it must be able to withstand the conditions of the solder both without being deformed or destroyed. The compositions are appiled to substrates in liquid form and are then cured.

The compositions of the invention are made by dissolving vinyl chloride/vinyl acetate copolymer in ketone solvent to form a first solution, dissolving epoxy resin and epoxy hardner in ester solvent to form a second solution and then mixing the first and second solutions with silver flake to form a mixture such that the silver flake is thoroughly dispersed and wetted. The weight ratio of silver flake to vinyl chloride/vinyl acetate copolymer to epoxy resin is from about 68:4:4 to about 75:6:2. The weight ratio of epoxy resin to epoxy hardner is from about 40:60 to about 36:63. The weight ratio of vinyl chloride/vinyl acetate to ketone solvent is from about 15:85 to about 25:75 and the weight ratio of the epoxy resin and epoxy hardner to ester solvent is from about 100:1 to about 75:25. The weight ratio of the first solution to the second solution is from about 100:1 to about 88:12. The vinyl chloride/vinyl acetate copolymer is present in an amount of from about 15% to about 25%, of the first solution, by weight. The epoxy resin and epoxy hardner is present in an amount from 70% to about 99% of the second solution, by weight, and the silver flake is present in an amount of from about 68% to about 75% of the total mixture, by weight.

There are no special techniques involved in carrying out the method of this invention other than the vinyl chloride/vinyl acetate copolymer must be dissolved in ketone solvent and the epoxy resin and epoxy hardner must be dissolved in an ester solvent. The silver flake may be added by any conventional technique. The ketone solvent may be any ketone solvent such as, for example, gamma buteryolactone, acetone or cyclohexane, or the like. The ester solvent can be any ester solvent such as, for example, butyl Carbitol ® acetate and the like; butyl Carbitol ® acetate is an ester solvent supplied by Union Carbide. Prior to the application of the composition to the substrate the fineness of grind must be checked and found to be 25 microns or less. Fineness of grind can be checked using any standard technique employing a fineness of grind guage. If the fineness of grind is not 25 microns or less, then the composition should be passed through a 3 roll mill until the proper fineness of grind is obtained. Using feeler guages, the roll gaps should be set as follows: 0.002" gap between apron roll and middle roll and 0.015" gap between middle roll and back roll. The composition should not be passed through the 3 roll mill more than three times. Additionally, the viscosity of the composition should range from about 30,000 cps to about 100,000 cps at 25° C. when measured using a standard Brookfield viscometer. Preferably, the viscosity is between about 30,000 cps and about 70,000 cps.

The mixture so formed can be applied to a substrate by any one of a number of techniques such as by silk screening, spraying, brushing. The substrate may be flexible or rigid and may be of a variety of types such as resinous or ceramic. Typical examples of substrates are printed circuit boards and membrane key boards. The mixture can be applied at a thickness of 1 mil or more. Once applied to the substrate, the mixture is subsequently dried and cured at a temperature of from about 100° C. to about 170° C. for about 15 to about 60 minutes. The drying and curing can be carried out by any one of a number of conventional techniques such as baking in an oven.

The compositions of this invention may be bonded directly to substrates. The method is simply applying a conductive composition onto a substrate comprising bonding the conductive composition comprising silver exclusively in the form of flake and a resin system consisting essentially of vinyl chloride/vinyl acetate copolymer, epoxy resin and epoxy hardner directly to the substrate. The substrate does not need to have been pretreated or precoated with any particular composition or by any process. Once dried and cured the compositions demonstrate good adhesion to the substrate. The average force required to remove the composition from a rigid substrate is greater than 500 p.s.i. Examples of flexible substrates that can be coated with the compositions of the instant invention are polyimide substrates such as that made by E.I. DuPont de Nemour and sold under the trademark Kapton ® and polyester substrates such as that made by E.I. DuPont de Nemour and sold under the trademark Mylar ®.

In measuring the force required to remove (or destroy) the composition from a rigid substrate, a pad of compositional material is coated on the substrate one tenth of an inch square. This pad is then soldered. A 22 gauge tin coated copper wire is then soldered into the pad perpendicular to the substrate. The force required to tear the pad off of the substrate is then measured by conventional means. Any failure is in the ability of the pad to adhere to the substrate, not in the wire adhering to the pad. Any removal of the composition or deterioration of the composition is considered a failure. In measuring the adhesion of the composition on a flexible substrate, a standard cross hatch adhesion test is applied. A circuit design is printed. A razor blade is then used to cut a cross hatch pattern in the design. Scotch tape is then applied to the pattern and pressure applied. Then the scotch tape is peeled off and observations made as to whether any composition has been removed from the substrate. A composition either passes or fails.

In order that those skilled in the art will better be able to practice. The invention, the following examples are given by way of illustration, and not by way of limitation.

EXAMPLES

Example I

Method of Making a Conductive Composition

A first solution was made by dissolving vinyl chloride/vinyl acetate copolymer having a number average molecular weight of 20,000 in gamma butylolactone.

A second solution was made by dissolving epoxy resin sold by Ciba Geigy under the trade designation Araldite 6010 and epoxy hardner also sold by Ciba Geigy under the trade designation HY940 in butyl Carbitol ® acetate.

These two solutions were then mixed together and silver flake having an average particle size of 2 microns was added such that the total composition had the following makeup:
69.52%: Silver flake
22.0%: gamma butyrolactone
5.44%: vinyl chloride/vinyl acetate copolymer
0.66%: butyl Carbitol ® acetate
0.87%: Araldite ® 6010
1.49%: epoxy hardner - HY940

The mixture is blended until the silver flake is thoroughly dispersed and wetted.

The composition is then passed through a 3 roll mill that had a 0.002" gap between the apron roll and the middle role and a 0.015" gap between the middle roll and the back roll. The composition was passed through the 3 roll mill until a fineness of grain of 23 microns was obtained.

The viscosity of the composition was 60,000 cps.

EXAMPLE II

The composition of Example I was applied directly to a rigid substrate by silk screening. It was then dried and cured at 125° C. for 30 minutes.
Adhesion was 500 p.s.i.
Conductivity was 25 milliohms/sq/mil.
Solderability was good when solder applied at 200° C., and the solder had the following compositional make-up: 62% tin; 36% lead; 2% silver.

EXAMPLE III

The composition of Example I was applied directly to a flexible substrate. It was then dried and cured at 125° C. for 30 minutes.
The composition passed the crosshatch adhesion test.
Resistivity was 25–27 milliohm/sq/mil.
Solderability was good when solder was applied at 200° C. and the solder had the following compositional makeup: 62% tin; 36% lead; 2% silver.

What is claimed is:

1. A directly solderable and flexible conductive composition comprising from about 88% to about 95% by weight silver and a resin system comprising, based on total weight of said composition:
   (a) from about 4% to about 7% by weight vinyl chloride/vinyl acetate copolymer;
   (b) from about 0.25% to about 2% by weight epoxy resin; and
   (c) from about 0.5% to about 3% by weight epoxy hardener;
said silver being 100% in the form of flake having an average particle size from about 0.5 to about 50 microns, said vinyl chloride/vinyl acetate copolymer having a number average molecular weight from about 14,000 to 35,000 and containing no carboxylic acid groups, and said epoxy being non-aqueous-based and heat curable.

2. The composition of claim 1 wherein the ratio of vinyl chloride to vinyl acetate is from about 80:20 to about 90:10.

3. A method of making a conductive composition of claim 1 comprising dissolving said vinyl chloride/vinyl acetate copolymer in ketone solvent to form a first solution, dissolving said epoxy resin and epoxy hardener in ester solvent to form a second solution and then mixing the first and second solutions with said silver flake to form a mixture.

4. The method of claim 3 wherein the weight ratio of silver flake to vinyl chloride/vinyl acetate copolymer to epoxy resin is from about 68:4:4 to about 75:6:2.

5. The method of claim 3 wherein the weight ratio of epoxy resin to epoxy hardner is from about 40:60 to about 36:63.

6. The method of claim 3 wherein the weight ratio of vinyl chloride/vinyl acetate copolymer to ketone solvent is from about 15:85 to about 25:75.

7. The method of claim 3 wherein the weight ratio of epoxy resin and epoxy hardner to ester solvent is from about 100:1 to about 75:25.

8. The method of claim 3 wherein the weight ratio of the first solution to the second solution is from about 100:1 to about 88:12.

9. The method of claim 3 wherein the vinyl chloride/vinyl acetate copolymer is present in an amount of from about 15% to about 25%, of the first solution, by weight, the epoxy resin and epoxy hardener is present in an amount of from about 70% to about 99% of the second solution, by weight, and the silver flake is present in an amount of from about 68% to about 75% of the total mixture, by weight.

10. The method of claim 3 additionally comprising applying the mixture to a substrate, then drying and curing the mixture.

11. The method of claim 10 wherein the mixture is applied by silk screening.

12. The method of claim 10 wherein the substrate is flexible.

13. The method of claim 10 wherein the mixture is dried and cured at a temperature of from abut 100° C. to about 170° C. from about 15 to 60 minutes.

14. A method of applying a conductive composition onto a substrate comprising bonding the conductive composition of claim 1 directly to the substrate.

15. The method of claim 14 wherein the force required to remove the conductive composition from a rigid substrate is greater than 500 p.s.i.

16. The method of claim 14 wherein the substrate is flexible.

* * * * *